(12) United States Patent
Sekiya et al.

(10) Patent No.: US 10,164,603 B2
(45) Date of Patent: Dec. 25, 2018

(54) ELASTIC WAVE DEVICE, COMMUNICATION MODULE APPARATUS, AND METHOD FOR MANUFACTURING ELASTIC WAVE DEVICE

(71) Applicant: Murata Manufacturing Co., Ltd., Nagaokakyo-shi, Kyoto-fu (JP)

(72) Inventors: Daisuke Sekiya, Nagaokakyo (JP); Taku Kikuchi, Nagaokakyo (JP); Yasuhiko Hirano, Nagaokakyo (JP); Hiroshi Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/687,587

(22) Filed: Aug. 28, 2017

(65) Prior Publication Data

US 2017/0358728 A1 Dec. 14, 2017

Related U.S. Application Data

(63) Continuation of application No. PCT/JP2016/054465, filed on Feb. 16, 2016.

(30) Foreign Application Priority Data

Mar. 27, 2015 (JP) ................................ 2015-066206

(51) Int. Cl.
*H03H 9/10* (2006.01)
*H03H 9/54* (2006.01)
(Continued)

(52) U.S. Cl.
CPC ........... *H03H 9/1092* (2013.01); *H01L 23/29* (2013.01); *H01L 23/31* (2013.01); *H01L 41/053* (2013.01);
(Continued)

(58) Field of Classification Search
CPC .......... H03H 3/02; H03H 3/08; H03H 9/0523; H03H 9/0542; H03H 9/059; H03H 9/1014;
(Continued)

(56) References Cited

U.S. PATENT DOCUMENTS 8,748,755 B2 6/2014 Inoue et al.
2006/0006760 A1* 1/2006 Namba ................. H01L 21/568
310/313 R (Continued)

FOREIGN PATENT DOCUMENTS

JP 2000-261284 A 9/2000
JP 2012-199833 A 10/2012
(Continued)

OTHER PUBLICATIONS

Official Communication issued in International Patent Application No. PCT/JP2016/054465, dated May 17, 2016.

*Primary Examiner* — Barbara Summons
(74) *Attorney, Agent, or Firm* — Keating & Bennett, LLP

(57) ABSTRACT

An elastic wave device includes an elastic wave element that includes first support layers provided on a piezoelectric substrate, a second support layer provided on the piezoelectric substrate so as to surround the first support layers when viewed in a plan view, and a cover member provided on the first support layers and the second support layer, a mounting substrate on which the elastic wave element is mounted, and a mold resin provided on the mounting substrate and sealing the elastic wave element. A thickness of each of the first support layers is less than a thickness of the second support layer. The cover member convexly curves towards the piezoelectric substrate so as to be spaced away from the mounting substrate. A space between the mounting substrate and the cover member is filled with the mold resin.

19 Claims, 10 Drawing Sheets

(51) Int. Cl.
*H03H 9/64* (2006.01)
*H03H 3/02* (2006.01)
*H03H 3/08* (2006.01)
*H01L 41/053* (2006.01)
*H01L 41/23* (2013.01)
*H01L 23/29* (2006.01)
*H01L 23/31* (2006.01)
*H03H 9/05* (2006.01)
*H03H 9/25* (2006.01)

(52) U.S. Cl.
CPC ............ *H01L 41/23* (2013.01); *H03H 3/02* (2013.01); *H03H 3/08* (2013.01); *H03H 9/059* (2013.01); *H03H 9/0523* (2013.01); *H03H 9/0542* (2013.01); *H03H 9/105* (2013.01); *H03H 9/54* (2013.01); *H03H 9/64* (2013.01); *H01L 2224/11* (2013.01); *H03H 9/1014* (2013.01); *H03H 9/1071* (2013.01); *H03H 9/25* (2013.01)

(58) Field of Classification Search
CPC .... H03H 9/105; H03H 9/1042; H03H 9/1071; H03H 9/1085; H03H 9/1092; H03H 9/25; H03H 9/54; H03H 9/64; H01L 23/29; H01L 23/31; H01L 23/3107; H01L 23/3114; H01L 23/3121; H01L 23/315; H01L 41/053; H01L 41/0533; H01L 41/23; H01L 2224/11
USPC ..... 333/187, 189, 193–196; 310/313 R, 340, 310/345, 348
See application file for complete search history.

(56) References Cited

U.S. PATENT DOCUMENTS

| | | |
|---|---|---|
| 2012/0241211 A1 | 9/2012 | Inoue et al. |
| 2013/0205586 A1* | 8/2013 | Takada ................. H03H 9/0523 29/829 |
| 2013/0335171 A1* | 12/2013 | Yamato ................. H03H 9/059 333/193 |
| 2014/0003017 A1 | 1/2014 | Kai et al. |
| 2014/0003196 A1* | 1/2014 | Tajima .................... G10K 11/18 367/140 |
| 2014/0042870 A1 | 2/2014 | Ohashi et al. |
| 2014/0191617 A1 | 7/2014 | Ohashi et al. |
| 2015/0249438 A1* | 9/2015 | Hira ...................... H03H 9/059 310/313 C |
| 2016/0036410 A1* | 2/2016 | Tsuda ................. H03H 9/14541 333/193 |
| 2016/0149557 A1 | 5/2016 | Hira et al. |
| 2016/0248399 A1* | 8/2016 | Oikawa .............. H03H 9/02897 |
| 2017/0366158 A1* | 12/2017 | Koreeda ................. H03H 3/08 |

FOREIGN PATENT DOCUMENTS

| | | |
|---|---|---|
| JP | 5141852 B2 | 2/2013 |
| JP | 2014-007722 A | 1/2014 |
| JP | 2014-014131 A | 1/2014 |
| WO | 2012/144370 A1 | 10/2012 |
| WO | 2015/022856 A1 | 2/2015 |
| WO | WO 2015/046402 A1 * | 4/2015 |

* cited by examiner

ELASTIC WAVE DEVICE, COMMUNICATION MODULE APPARATUS, AND METHOD FOR MANUFACTURING ELASTIC WAVE DEVICE

CROSS REFERENCE TO RELATED APPLICATIONS

This application claims the benefit of priority to Japanese Patent Application No. 2015-066206 filed on Mar. 27, 2015 and is a Continuation Application of PCT Application No. PCT/JP2016/054465 filed on Feb. 16, 2016. The entire contents of each application are hereby incorporated herein by reference.

BACKGROUND OF THE INVENTION

1. Field of the Invention

The present invention relates to an elastic wave device in which an elastic wave element having a WLP (Wafer Level Package) structure is mounted on a mounting substrate, a communication module apparatus, and a method for manufacturing an elastic wave device.

2. Description of the Related Art

Conventionally, an elastic wave device in which an elastic wave element having a WLP structure is mounted on a mounting substrate has been widely used for a cellular phone or other devices.

Japanese Patent No. 5141852, discloses an elastic wave element in which a support body is provided on a piezoelectric substrate so as to surround a function portion on the piezoelectric substrate. Furthermore, on the piezoelectric substrate, a support column is provided in a portion surrounded by the support body. Japanese Unexamined Patent Application Publication No. 2014-14131, discloses an elastic wave element including a cover member the center portion of which curves so as to approach a piezoelectric substrate side. The elastic wave element is sandwiched by two insulating layers from an upper surface and a lower surface, and a side surface thereof is covered by a third insulating layer. Japanese Unexamined Patent Application Publication No. 2014-14131 describes that, when pressure bonding the three insulating layers, by the pressure being applied to the cover member, the cover member curves.

Recently, there is a demand for further reduction in the height of an elastic wave device. Accordingly, a distance between a mounting substrate and a cover member of an elastic wave element is further narrowed. However, a cover member in Japanese Patent No. 5141852 is flat. Therefore, when the elastic wave element is sealed with a mold resin, a space between a mounting substrate and the cover member is not sufficiently filled with the mold resin in some cases.

In Japanese Unexamined Patent Application Publication No. 2014-14131, the elastic wave element is sealed with the pressure-bonded three insulating layers.

SUMMARY OF THE INVENTION

Preferred embodiments of the present invention provide elastic wave devices, communication module apparatuses, and methods for manufacturing elastic wave devices in which a space between a mounting substrate and a cover member is sufficiently filled with a mold resin, and the cover member is not easily recessed.

An elastic wave device according to a preferred embodiment of the present invention includes an elastic wave element including a piezoelectric substrate that includes a pair of main surfaces opposing each other, an excitation electrode provided on one main surface of the piezoelectric substrate, at least one first support layer provided on the one main surface of the piezoelectric substrate, a second support layer provided on the one main surface of the piezoelectric substrate so as to surround the excitation electrode and the first support layer when viewed in a plan view, and a cover member provided on the first and second support layers and sealing the excitation electrode together with the second support layer and the piezoelectric substrate; a mounting substrate on which the elastic wave element is mounted; and a mold resin provided on the mounting substrate and sealing the elastic wave element, in which a thickness of the first support layer is less than a thickness of the second support layer, the cover member convexly curves towards the piezoelectric substrate so as to be spaced away from the mounting substrate, and a space between the mounting substrate and the cover member is filled with the mold resin.

In an elastic wave device according to a preferred embodiment of the present invention, preferably each of the at least one first support layer has a width direction in a direction crossing the first support layer, the second support layer has a width direction in a direction crossing the second support layer, and a width of the at least one first support layer is narrower than a width of the second support layer. In this case, it is possible to increase an area of a portion in which the excitation electrode is disposed.

In an elastic wave device according to another preferred embodiment of the present invention, a plurality of the first support layers are preferably provided, a width of at least one first support layer of the plurality of first support layers is narrower than widths of other first support layers, and a thickness of at least one first support layer of the plurality of first support layers is less than thicknesses of other first support layers. In this case, it is possible to increase an area of a portion in which the excitation electrode is disposed.

In an elastic wave device according to another preferred embodiment of the present invention, when the elastic wave device is viewed in a plan view, the first support layer preferably makes contact with the second support layer at both ends. In this case, the first support layer is able to support the second support layer in a side surface direction, and thus, strength is further improved.

In an elastic wave device according to another preferred embodiment of the present invention, the first support layer preferably includes one end portion and another end portion, the one end portion of the first support layer makes contact with the second support layer, and a shape of the other end portion of the first support layer is larger than a shape of a portion other than the other end portion, when the elastic wave device is viewed in a plan view. In this case, it is possible to stably support the cover member.

A communication module apparatus according to a preferred embodiment of the present invention includes a front-end portion including the elastic wave device configured in accordance with a preferred embodiment of the present invention, and an active element connected to the front-end portion. In this case, it is possible to more sufficiently fill the space between the mounting substrate and the cover member with the mold resin.

A method for manufacturing the elastic wave device according to a preferred embodiment of the present invention includes a step of manufacturing an elastic wave element including a piezoelectric substrate that includes a pair of main surfaces opposing each other, an excitation electrode provided on one main surface of the piezoelectric substrate, at least one first support layer provided on the one main surface of the piezoelectric substrate, a second support layer provided on the one main surface of the piezoelectric substrate so as to surround the excitation electrode and the first support layer when viewed in a plan view, and a cover member provided on the first and second support layers, and sealing the excitation electrode together with the second support layer and the piezoelectric substrate; a step of mounting the elastic wave element on a mounting substrate; and a step of providing a mold resin on the mounting substrate and sealing the elastic wave element, in which in the step of manufacturing the elastic wave element, the first and second support layers are provided such that a thickness of the first support layer is less than a thickness of the second support layer, and the cover member is convexly curved towards the piezoelectric substrate so as to be away from the mounting substrate, in the step of sealing the elastic wave element, the mold resin is provided so as to fill a space between the mounting substrate and the cover member with the mold resin. In this case, it is possible to more sufficiently fill the space between the mounting substrate and the cover member with the mold resin.

In a method for manufacturing the elastic wave device according to a preferred embodiment of the present invention, a plurality of the first support layers are provided, and the plurality of first support layers are provided such that a width of at least one first support layer of the plurality of first support layers is smaller than widths of other first support layers. In this case, it is possible to easily make a thickness of at least one first support layer less than a thickness of the second support layer. Accordingly, productivity is able to be enhanced. Furthermore, the first support layer with a wide width is included, and thus, strength is able to be improved.

According to various preferred embodiments of the present invention, it is possible to provide elastic wave devices, communication module apparatuses, and methods for manufacturing elastic wave devices in which a space between a mounting substrate and a cover member is sufficiently filled with a mold resin, and the cover member is not easily recessed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described with reference to specific preferred embodiments of the present invention and the drawings.

Note that the various preferred embodiments disclosed in the present specification are merely examples, and it is to be understood that partial replacements or combinations of configurations among different preferred embodiments are also possible.

Figure 1:
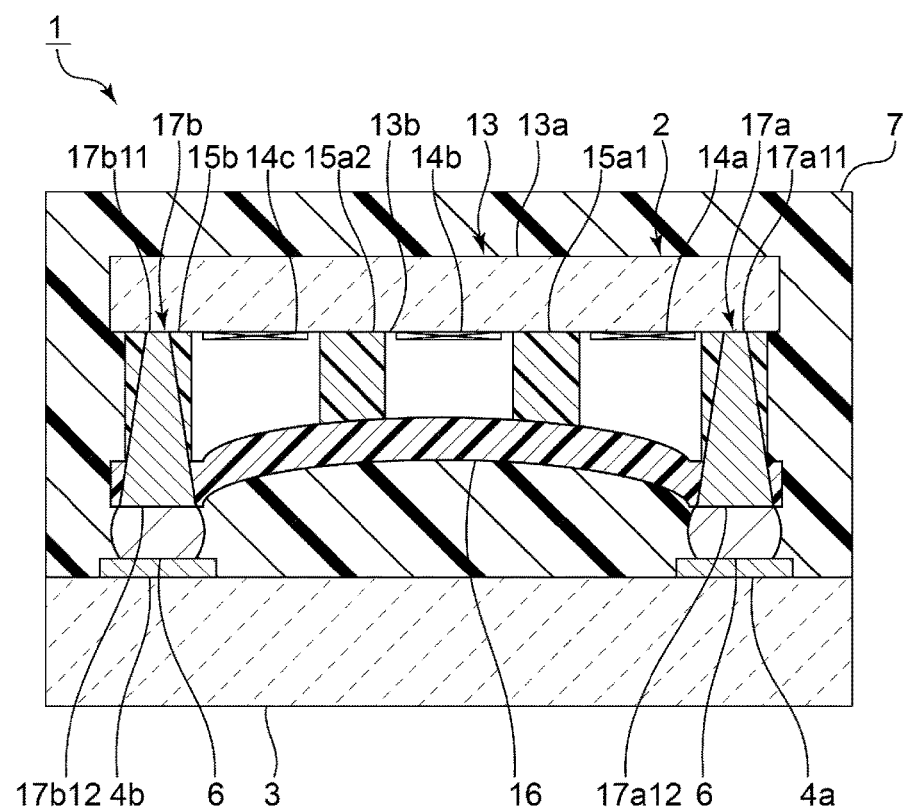
FIG. 1 is a front cross-sectional view of an elastic wave device according to a first preferred embodiment of the present invention.

FIG. 1 is a front cross-sectional view of an elastic wave device according to a first preferred embodiment of the present invention. Note that, in the drawings of the present application, an excitation electrode, which will be described later, is illustrated using a schematic diagram obtained by drawing diagonal lines in a rectangle.

An elastic wave device 1 includes a mounting substrate 3. Although the material of the mounting substrate 3 is not particularly limited, for example, a ceramic material or other suitable material may be used.

On the mounting substrate 3, an elastic wave element 2 is mounted. To be more specific, electrode lands 4a and 4b are provided on the mounting substrate 3. Although details will be described later, the elastic wave element 2 includes a piezoelectric substrate 13. A second support layer 15b is provided on a lower side of the piezoelectric substrate 13 in FIG. 1. A cover member 16 is provided on a lower side of the second support layer 15b. A plurality of bumps 6 are provided on a lower side of the cover member 16. The bumps 6 are made of solder or other suitable conductive material. The elastic wave element 2 is bonded to the electrode lands 4a and 4b using the bumps 6.

On the mounting substrate 3, a mold resin 7 is provided. The elastic wave element 2 is sealed with the mold resin 7.

A unique characteristic of the present preferred embodiment is that the cover member 16 convexly curves towards the piezoelectric substrate 13 so as to be spaced away from the mounting substrate 3. This makes it possible to sufficiently fill spaces including a space between the cover member 16 and the mounting substrate 3 with the mold resin 7. Furthermore, with the presence of first support layers 15a1 and 15a2 supporting the cover member 16, the cover member 16 is not easily recessed. In other words, with the presence of the first support layers 15a1 and 15a2, the cover member 16 is able to be supported. Accordingly, while securing a high filling property of the mold resin 7 with respect to the spaces including the space between the cover member 16 and the mounting substrate 3, it is possible to have superior durability. This will be described with reference to details of the configuration of the elastic wave element 2.

Figure 2A:
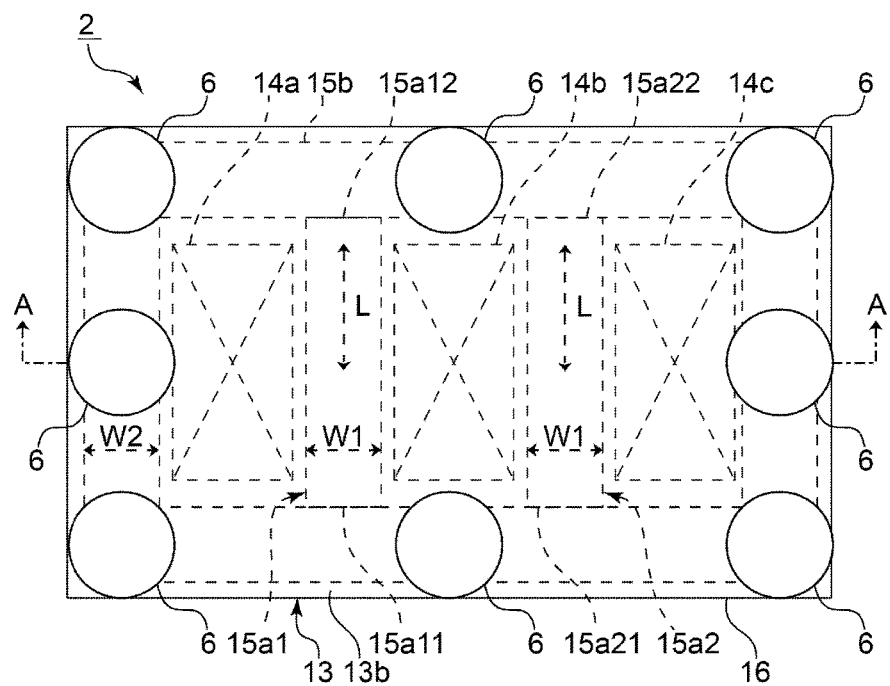
FIG. 2A is a plan view of an elastic wave element in the first preferred embodiment of the present invention.
Figure 2B:
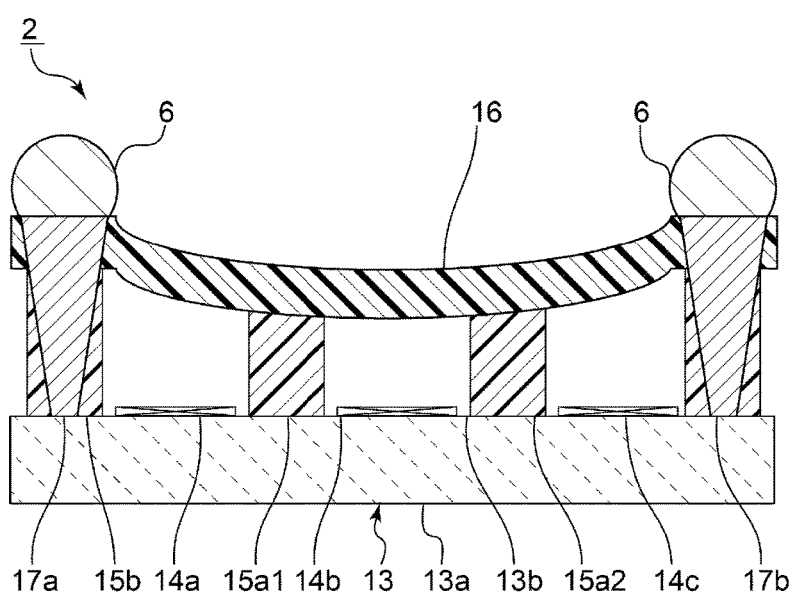
FIG. 2B is a cross-sectional view of the elastic wave element taken along a line A-A in FIG. 2A.

FIG. 2A is a plan view of the elastic wave element in the first preferred embodiment of the present invention. FIG. 2B is a cross-sectional view of the elastic wave element taken along a line A-A in FIG. 2A.

As described above, the elastic wave element 2 includes the piezoelectric substrate 13. As illustrated in FIG. 2B, the piezoelectric substrate 13 includes a first main surface 13a and a second main surface 13b which are a pair of main surfaces opposing each other. The piezoelectric substrate 13 is preferably made of a piezoelectric single-crystal, such as $LiNbO_3$, $LiTaO_3$, or other suitable material, for example, but is not particularly limited thereto. The piezoelectric substrate 13 may be made of piezoelectric ceramics or other suitable material.

On the second main surface 13b of the piezoelectric substrate 13 as one main surface, the excitation electrodes are provided. In the present preferred embodiment, the excitation electrodes are a plurality of interdigital transducer (IDT) electrodes 14a to 14c. By applying a voltage to each of the IDT electrodes 14a to 14c, surface acoustic waves are excited. Although not illustrated in the drawings, in the present preferred embodiment, on both sides of the IDT electrode 14a in a propagation direction of the surface acoustic waves, reflectors are preferably provided. With this configuration, an elastic wave resonator is provided. In the same or similar manner, elastic wave resonators using the IDT electrodes 14b and 14c as excitation electrodes are each provided as well. In the elastic wave element 2, a filter including each of the elastic wave resonators described above is provided. Note that, a circuit configuration of the elastic wave element 2 is not particularly limited.

As illustrated in FIG. 2A, on the second main surface 13b of the piezoelectric substrate 13, the plurality of first support layers 15a1 and 15a2 and the second support layer 15b are provided. The first support layer 15a1 is provided between the IDT electrode 14a and the IDT electrode 14b. The first support layer 15a2 is provided between the IDT electrode 14b and the IDT electrode 14c. Note that, it is sufficient that at least one first support layer is provided.

The first support layers 15a1 and 15a2 have a length direction L and a width direction W1 perpendicular or substantially perpendicular to a thickness direction of the first support layers 15a1 and 15a2. The second support layer 15b has a width direction W2 as a direction crossing the second support layer 15b. The first support layers 15a1 and 15a2 preferably have a rectangular or substantially rectangular shape, when viewed in a plan view from the second main surface 13b side of the piezoelectric substrate 13. The first support layer 15a1 includes two end portions 15a11 and 15a12 in the length direction L. The first support layer 15a2 includes two end portions 15a21 and 15a22 in the length direction L. Note that, a planar shape of the first support layers 15a1 and 15a2 is not particularly limited. A planar shape of the first support layers 15a1 and 15a2 may include a bending portion, for example.

The second support layer 15b surrounds the IDT electrodes 14a to 14c and the first support layers 15a1 and 15a2, when viewed in a plan view from the second main surface 13b side of the piezoelectric substrate 13. Both of the end portions 15a11 and 15a12 of the first support layer 15a1 and both of the end portions 15a21 and 15a22 of the first support layer 15a2 make contact with the second support layer 15b. In the present preferred embodiment, a width of the first support layers 15a1 and 15a2 is preferably the same or substantially the same as a width of the second support layer 15b. Note that, the width of the first support layers 15a1 and 15a2 may be different from the width of the second support layer 15b. As illustrated in FIG. 2B, a thickness of each of the first support layers 15a1 and 15a2 is preferably less than a thickness of the second support layer 15b.

On the first support layers 15a1 and 15a2 and the second support layer 15b, the cover member 16 is provided. To be more specific, the cover member 16 is provided so as to make contact with the first support layers 15a1 and 15a2 and the second support layer 15b. Accordingly, the cover member 16 has a shape that corresponds to the difference between the thickness of the first support layers 15a1 and 15a2 and the thickness of the second support layer 15b. Because the thickness of each of the first support layers 15a1 and 15a2 is less than the thickness of the second support layer 15b, the cover member 16 convexly curves toward the piezoelectric substrate 13 so as to approach the piezoelectric substrate 13.

Under-bump metal layers 17a and 17b pass through the second support layer 15b and the cover member 16. The under-bump metal layer 17a includes first and second end portions 17a11 and 17a12. The under-bump metal layer 17b includes first and second end portions 17b11 and 17b12. The first end portions 17a11 and 17b11 of the under-bump metal layers 17a and 17b each extend to the piezoelectric substrate 13.

On the cover member 16, the plurality of bumps 6 are provided. The second end portions 17a12 and 17b12 of the under-bump metal layers 17a and 17b are connected to the bumps 6, respectively. Although not illustrated in the drawings, the IDT electrodes 14a to 14c are electrically connected to the under-bump metal layer 17a or the under-bump metal layer 17b. As illustrated in FIG. 1, each of the bumps 6 is bonded to the electrode lands 4a and 4b. The IDT electrodes 14a to 14c are electrically connected to the mounting substrate 3 through the electrode lands 4a and 4b, each of the bumps 6, and the under-bump metal layer 17a or the under-bump metal layer 17b.

Incidentally, in recent years, there has been a demand for further reduction in the height of the elastic wave device. Therefore, a distance between the mounting substrate and the cover member is further narrowed. When the mold resin is provided, filling with a solid mold resin softened with heat, while applying pressure, is performed. However, it was difficult to fill a narrow space with the mold resin. Therefore, a space between the mounting substrate and the cover member was not sufficiently filled with the mold resin in some cases.

In contrast, returning to FIG. 1, in the present preferred embodiment, the cover member 16 convexly curves toward the piezoelectric substrate 13 so as to be spaced away from the mounting substrate 3. Accordingly, the distance between the mounting substrate 3 and the cover member 16 is widened. And thus, it is possible to easily fill the space between the mounting substrate 3 and the cover member 16 with the mold resin 7. As illustrated in FIG. 1, there is no gap between the cover member 16 and the mounting substrate 3, and the mold resin 7. In this manner, it is possible to reliably and sufficiently fill the space with the mold resin 7.

As illustrated in FIGS. 2A and 2B, the cover member 16 is provided so as to make contact with the first support layers 15*a*1 and 15*a*2. Accordingly, controlling the thickness of each of the first support layers 15*a*1 and 15*a*2 makes it possible to control the difference between the thickness of each of the first support layers 15*a*1 and 15*a*2 and the thickness of the second support layer 15*b*. Because the cover member 16 has a shape corresponding to the difference between the thickness of the first support layers 15*a*1 and 15*a*2 and the thickness of the second support layer 15*b*, it is possible to reliably control the degree of curvature of the cover member 16. By making the thickness of each of the first support layers 15*a*1 and 15*a*2 less than the thickness of the second support layer 15*b*, the cover member 16 is recessed towards a lower side as illustrated in FIG. 2B. With this configuration, as illustrated in FIG. 1, the space between the mounting substrate and the cover member is more sufficiently filled with the mold resin. Furthermore, both of the end portions 15*a*11 and 15*a*12 of the first support layer 15*a*1 and both of the end portions 15*a*21 and 15*a*22 of the first support layer 15*a*2 make contact with the second support layer 15*b*. With this configuration, the first support layers 15*a*1 and 15*a*2 support the second support layer 15*b* in a side surface direction, and thus, strength is further improved. Because the thickness of each of the first support layers 15*a*1 and 15*a*2 is less than the thickness of the second support layer 15*b*, a degree of thermal shrinkage of each of the first support layers 15*a*1 and 15*a*2, when the support layer resin is cured, is small. Accordingly, the second support layer 15*b* is not easily deformed. As a result, it is possible to improve not only the strength of the elastic wave element 2 in the thickness direction, but also the strength in the side surface direction.

Note that, it is not absolutely necessary for both of the end portions 15*a*11 and 15*a*12 of the first support layer 15*a*1 and both of the end portions 15*a*21 and 15*a*22 of the first support layer 15*a*2 to make contact with the second support layer 15*b*. In this case as well, it is possible to improve the strength in the thickness direction, and sufficiently fill the space with the mold resin.

Figure 3:
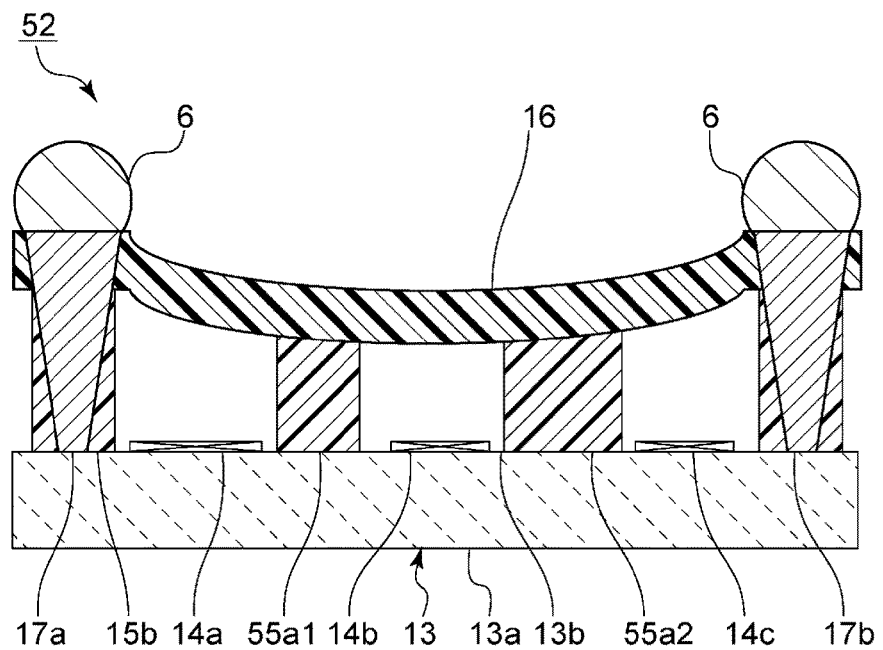
FIG. 3 is a front cross-sectional view of an elastic wave element in a first variation of the first preferred embodiment of the present invention.

As in the present preferred embodiment, in the case where the plurality of first support layers are provided, the width of at least one first support layer may be wider than the width of the second support layer. For example, in an elastic wave element 52 of a first variation illustrated in FIG. 3, first support layers 55*a*1 and 55*a*2 are provided. A width of the first support layer 55*a*2 is wider than the width of the second support layer 15*b*. In this case, the strength of the elastic wave element is able to be improved.

Figure 4A:
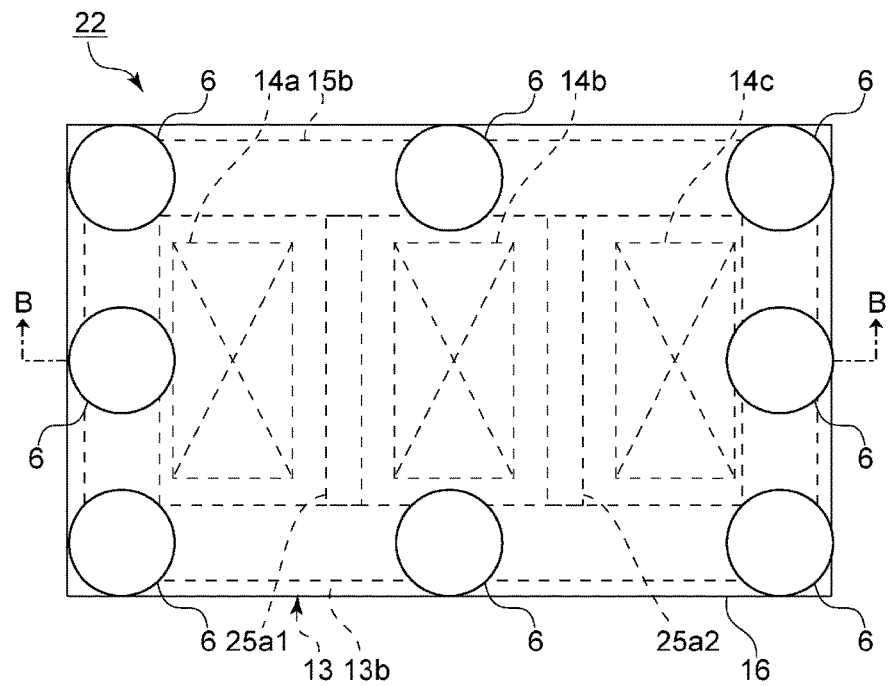
FIG. 4A is a plan view of an elastic wave element in a second preferred embodiment of the present invention.
Figure 4B:
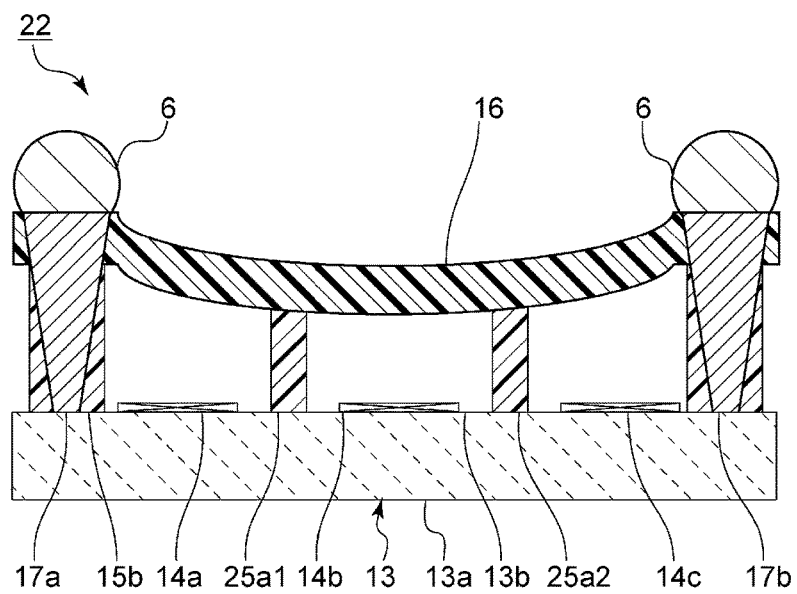
FIG. 4B is a cross-sectional view of the elastic wave element taken along a line B-B in FIG. 4A.

FIG. 4A is a plan view of an elastic wave element in a second preferred embodiment of the present invention. FIG. 4B is a cross-sectional view of the elastic wave element taken along a line B-B in FIG. 4A.

An elastic wave element 22 is different from that of the first preferred embodiment in that a width of each of first support layers 25*a*1 and 25*a*2 is narrower than the width of the second support layer 15*b*. The elastic wave element 22 and an elastic wave device of the second preferred embodiment have the same configuration as that of the elastic wave element 2 and the elastic wave device 1 of the first preferred embodiment except for the above-described point.

In the present preferred embodiment as well, it is possible to increase a distance between the mounting substrate and the cover member 16. Accordingly, it is possible to obtain the same or similar effects as those in the first preferred embodiment. Furthermore, because the width of each of the first support layers 25*a*1 and 25*a*2 is narrow, it is possible to increase an area of portions where the IDT electrodes 14*a* to 14*c* are disposed. Alternatively, it is also possible to decrease an area of the piezoelectric substrate 13, which makes it possible to reduce the size of the elastic wave element 22 and the elastic wave device.

Figure 5:
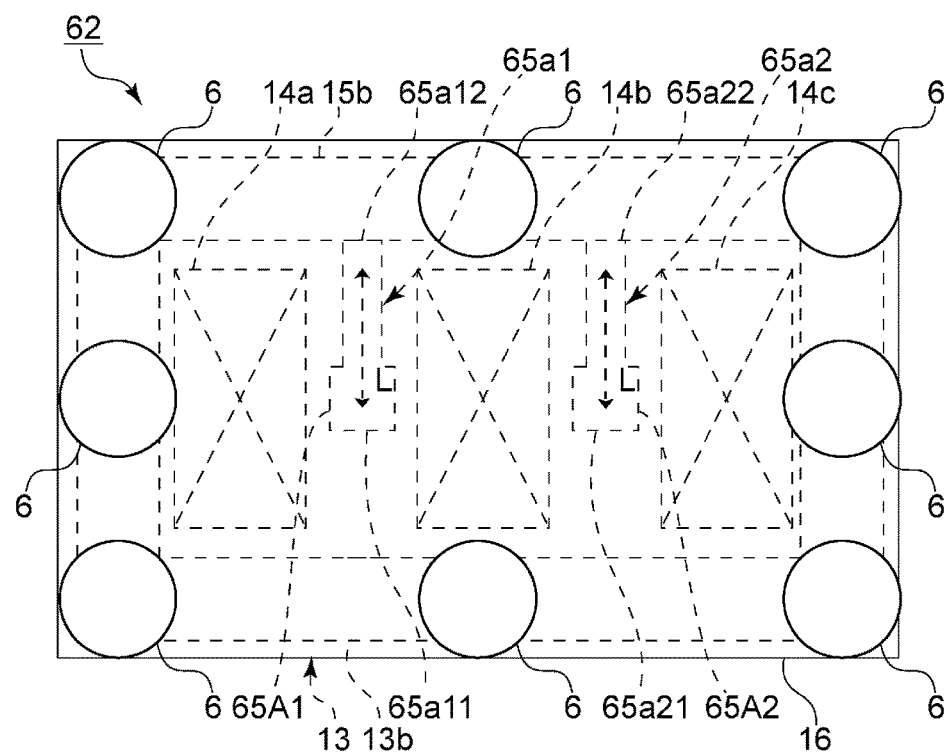
FIG. 5 is a plan view of an elastic wave element in a second variation of the second preferred embodiment of the present invention.

As in an elastic wave element 62 of a second variation of the second preferred embodiment illustrated in FIG. 5, first support layers 65*a*1 and 65*a*2 may preferably have wide width portions 65A1 and 65A2 with wider width than other portions. In other words, the shape of each of the wide width portions 65A1 and 65A2 is larger than the shape of the other portions. To be more specific, the wide width portion 65A1 is disposed in a position including one end portion 65*a*11 of the first support layer 65*a*1. The end portion 65*a*11 included in the wide width portion 65A1 of the first support layer 65*a*1 does not make contact with the second support layer 15*b*. One end portion 65*a*21 of the first support layer 65*a*2 is also included in the wide width portion 65A2, and does not make contact with the second support layer 15*b*. This makes it possible to increase an area of portions where the IDT electrodes 14*a* to 14*c* are disposed, and to stably support the cover member 16.

Note that, in the elastic wave element 62, the other end portions 65*a*12 and 65*a*22 of the first support layers 65*a*1 and 65*a*2 make contact with the second support layer 15*b*.

The position of the wide width portion 65A1 is not particularly limited. It is preferable that the wide width portion 65A1 be positioned in the vicinity of the center portion of the first support layer 65*a*1 in the length direction L in a case where both of the end portions 65*a*11 and 65*a*12 of the first support layer 65*a*1 make contact with the second support layer 15*b*. The above-described position is the farthest position from the second support layer 15*b* in length direction L. Accordingly, a hollow portion provided by the cover member 16, the second support layer 15*b*, and the piezoelectric substrate 13 is easily crushed at the above position by pressure in the thickness direction. Disposing the wide width portion 65A1 at the above-described position makes it possible to effectively improve strength of the elastic wave element 62. The same applies to the wide width portion 65A2.

The wide width portion 65A1 may be disposed at a position not including both of the end portions 65*a*11 and 65*a*12 of the first support layer 65*a*1. The wide width portion 65A2 may also be disposed at a position not including both of the end portions 65*a*21 and 65*a*22 of the first support layer 65*a*2. At this time, for example, both of the end portions 65*a*11 and 65*a*12 of the first support layer 65*a*1 and both of the end portions 65*a*21 and 65*a*22 of the first support layer 65*a*2 may make contact with the second support layer 15*b*. In this case, it is possible to further improve the strength of the elastic wave element 62.

As illustrated in FIG. 5, although a planar shape of each of the wide width portions 65A1 and 65A2 is preferably rectangular or substantially rectangular, the planar shape is not particularly limited. For example, it may be a polygonal shape, a circular shape, or other suitable shape.

Next, a non-limiting example of a method for manufacturing the elastic wave device according to the second preferred embodiment will be described.

Figure 6A:
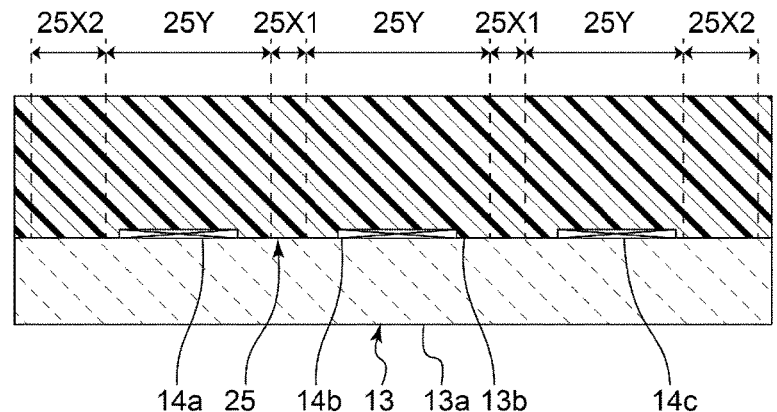
FIGS. 6A to 6C are front cross-sectional views for illustrating a method for manufacturing the elastic wave element in the second preferred embodiment of the present invention.
Figure 6B:
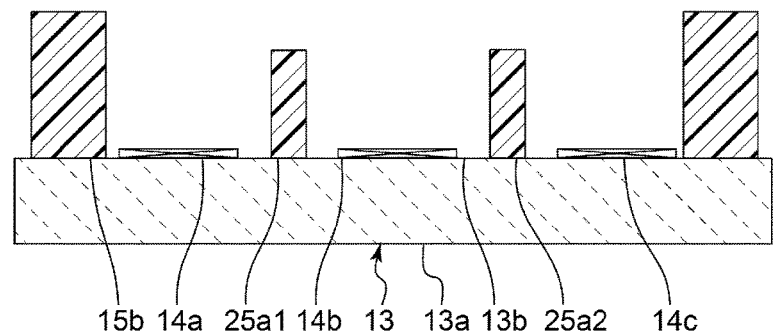
Figure 6C:
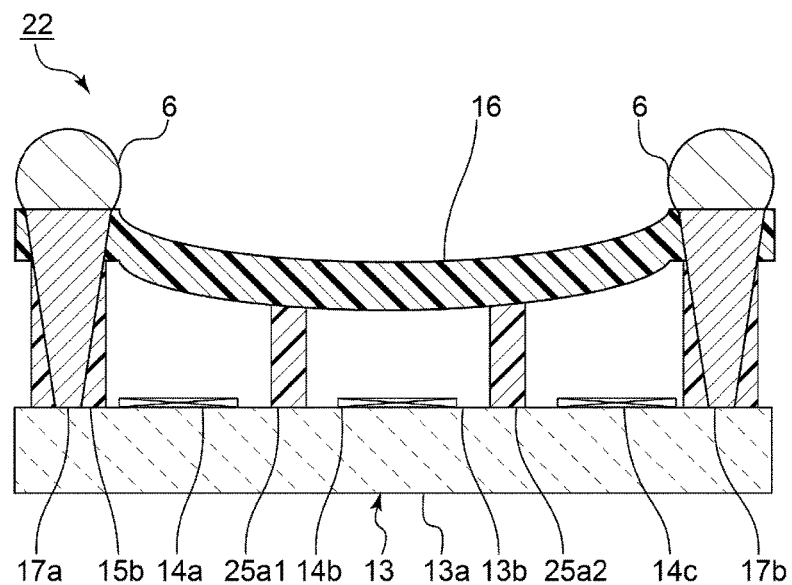
Figure 7A:
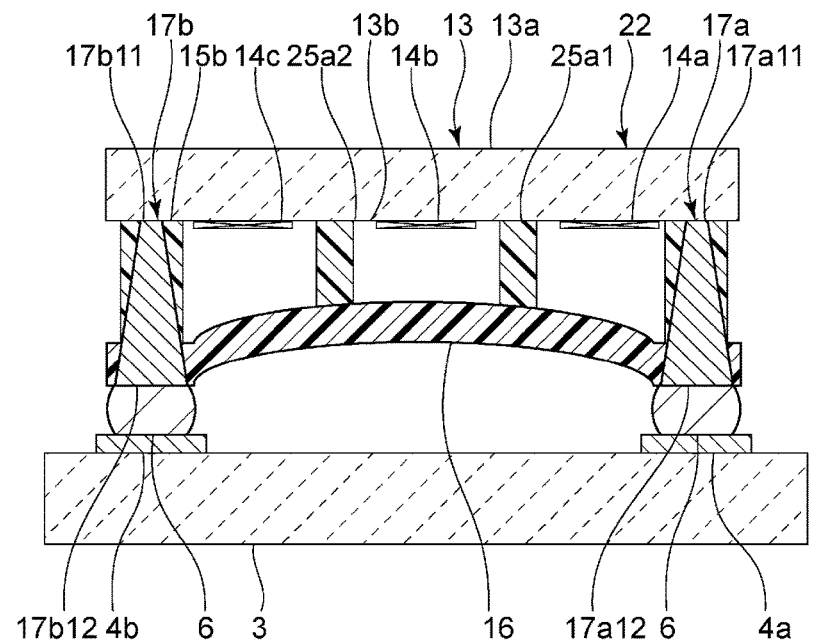
FIGS. 7A and 7B are front cross-sectional views for illustrating a method for manufacturing an elastic wave device according to the second preferred embodiment of the present invention.
Figure 7B:
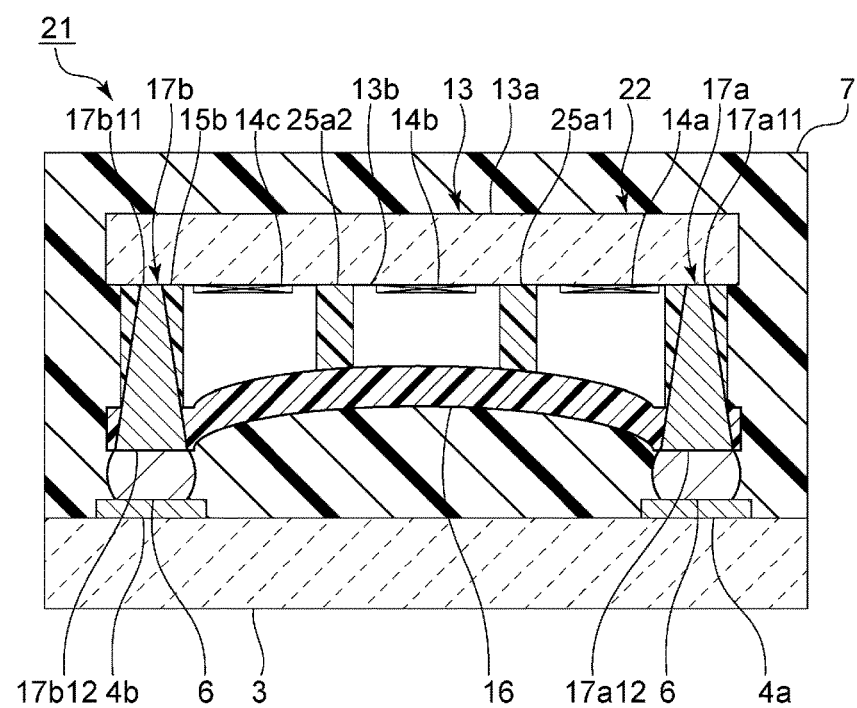

FIGS. 6A to 6C are front cross-sectional views for illustrating the method for manufacturing the elastic wave element in the second preferred embodiment. FIGS. 7A and 7B are front cross-sectional views for illustrating the method for manufacturing the elastic wave device according to the second preferred embodiment.

As illustrated in FIG. 6A, the piezoelectric substrate is prepared. Next, on the second main surface 13*b* of the piezoelectric substrate 13, the IDT electrodes 14*a* to 14*c* are provided. When providing the IDT electrodes 14a to 14c, for example, a metal film is formed by a sputtering method, a CVD method, or the like. Then, by a photolithography method or other suitable method, a metal film is patterned.

Next, on the second main surface 13b of the piezoelectric substrate 13, the first support layer and the second support layer are provided. The first support layer and the second support layer may be provided by the photolithography method or other suitable method, for example. In this case, the first support layer and the second support layer are able to be simultaneously provided.

To be more specific, as illustrated in FIG. 6A, a photocurable resin layer 25 is laminated on the second main surface 13b of the piezoelectric substrate 13. Next, a first region 25X1 and a second region 25X2 of the photocurable resin layer 25 are simultaneously exposed. At this time, the exposure is performed such that a width of the first region 25X1 becomes smaller than a width of the second region 25X2. With this process, the first and second regions 25X1 and 25X2 of the photocurable resin layer 25 are photo-cured. Because a third region 25Y of the photocurable resin layer 25 is not exposed, the third region 25Y is not photo-cured. Note that, a mask pattern used for the exposure is adjusted, which makes it possible to easily adjust the width of the first region 25X1 and the width of the second region 25X2.

At the above-described exposure, in the photocurable resin layer 25, an exposed area of the first region 25X1 is smaller than an exposed area of the second region 25X2. This makes it possible to make a photocuring reaction rate of the first region 25X1 smaller than a photocuring reaction rate of the second region 25X2. Accordingly, even when the first region 25X1 and the second region 25X2 are simultaneously exposed, it is possible to increase an uncured portion of the first region 25X1 more than an uncured portion of the second region 25X2.

Next, as illustrated in FIG. 6B, the uncured portion of the photocurable resin layer is removed by etching. With this process, the first support layers 25a1 and 25a2 are formed from the first region 25X1 of the photocurable resin layer 25 illustrated in FIG. 6A. The second support layer 15b is formed from the second region 25X2 of the photocurable resin layer 25.

At this time, the uncured portion of the first region 25X1 is larger than the uncured portion of the second region 25X2 illustrated in FIG. 6A. Accordingly, a portion in the first region 25X1 which is removed by etching is larger than a portion in the second region 25X2 which is removed by etching. Accordingly, the thicknesses of the first support layers 25a1 and 25a2 become less than the thickness of the second support layer 15b.

With the above-described photolithography method, the first support layers 25a1 and 25a2 and the second support layer 15b are able to be simultaneously provided. In addition, adjusting a line width through which the photocurable resin layer 25 is exposed makes it possible to adjust thicknesses of the first support layers 25a1 and 25a2 and the second support layer 15b. This makes it possible, at the same time as providing the first support layers 25a1 and 25a2 and the second support layer 15b, to form a difference between the thicknesses of both the first and second support layers. In this manner, productivity is effectively improved.

A method for providing the first support layers 25a1 and 25a2 and the second support layer 15b is not particularly limited. Adjustment of the thicknesses of the first support layers 25a1 and 25a2 and the second support layer 15b may be performed by polishing or other suitable method, for example.

Next, as illustrated in FIG. 6C, the cover member 16 is provided on the first support layers 25a1 and 25a2 and the second support layer 15b. At this time, the cover member 16 is provided so as to make contact with the first support layers 25a1 and 25a2 and the second support layer 15b. This causes the cover member 16 to convexly curve towards the piezoelectric substrate 13.

Next, a plurality of through-holes are provided in the cover member 16 and the second support layer 15b. Then, the under-bump metal layers 17a and 17b are provided such that the above-described plurality of through-holes are filled. The under-bump metal layers 17a and 17b may be provided by electrolytic plating or other suitable method, for example.

Subsequently, the bumps 6 are provided on the cover member 16 so as to connect to the under-bump metal layers 17a and 17b, respectively. Through this process, the elastic wave element 22 is obtained.

Next, as illustrated in FIG. 7A, the elastic wave element 22 is connected to the electrode lands 4a and 4b on the mounting substrate 3 with each of the bumps 6 interposed therebetween.

Next, as illustrated in FIG. 7B, the mold resin 7 is provided on the mounting substrate 3. With this process, the elastic wave element 22 is sealed. The cover member 16 of the elastic wave element 22 convexly curves towards the piezoelectric substrate 13 so as to be spaced away from the mounting substrate 3. Accordingly, it is possible to reliably and sufficiently fill a space between the mounting substrate 3 and the cover member 16 with the mold resin 7. With this method, the elastic wave device 21 is obtained.

Figure 8:
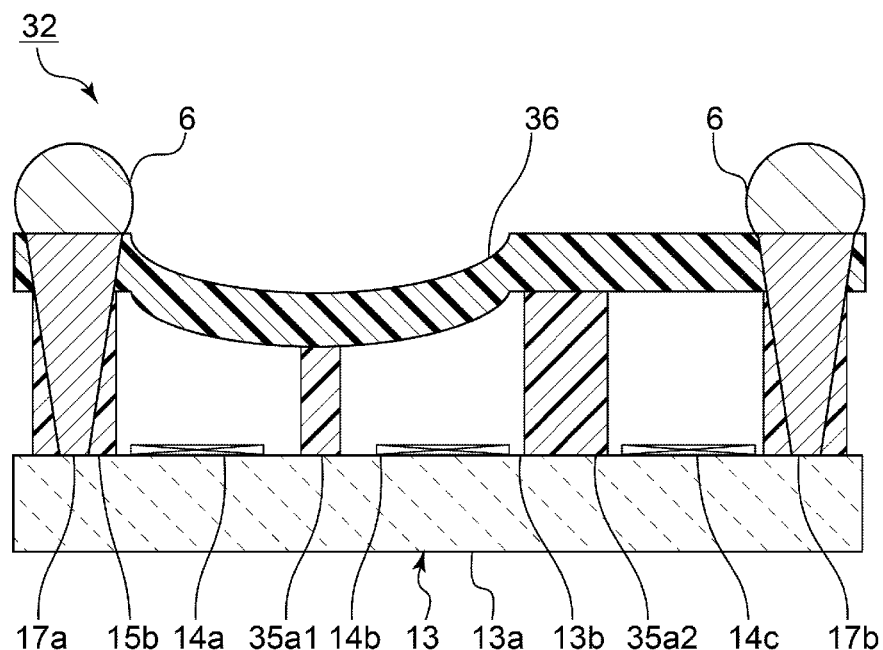
FIG. 8 is a front cross-sectional view of an elastic wave element in a third preferred embodiment of the present invention.

FIG. 8 is a front cross-sectional view of an elastic wave element in a third preferred embodiment of the present invention.

Preferably, a thickness of a first support layer 35a2 of an elastic wave element 32 is the same or substantially the same as the thickness of the second support layer 15b, and a width of the first support layer 35a2 is the same or substantially the same as the width of the second support layer 15b. A width of a first support layer 35a1 is narrower than the width of the first support layer 35a2, and a thickness of the first support layer 35a1 is less than the thickness of the first support layer 35a2 and the second support layer 15b. The elastic wave element 32 and an elastic wave device of the third preferred embodiment have the same or similar configuration as that of the elastic wave element 2 and the elastic wave device 1 of the first preferred embodiment except for the above-described points.

In this case as well, the cover member 36 convexly curves towards the piezoelectric substrate 13 side. Accordingly, the same or similar effects as those of the first preferred embodiment are able to be obtained.

It is possible to easily provide a difference between the width and the thickness of the first support layer 35a1 and the width and the thickness of the first support layer 35a2 and the width and the thickness of the second support layer 15b by the same or similar method as the method for manufacturing the elastic wave element 22 of the second preferred embodiment. Accordingly, productivity is able to be improved. Furthermore, the first support layer 35a2 with the wide width is included, and thus, high strength is obtained. Note that, the first support layer 35a1 may have a width equal to or larger than the width of the first support layer 35a2.

The elastic wave elements 2, 22 and 32 of the first preferred embodiment, the second preferred embodiment, and the third preferred embodiment preferably use surface acoustic waves. The present invention is not limited to the elastic wave element using the surface acoustic waves, and may also be applied to an elastic wave device having an elastic wave element using bulk waves, for example.

Figure 9A:
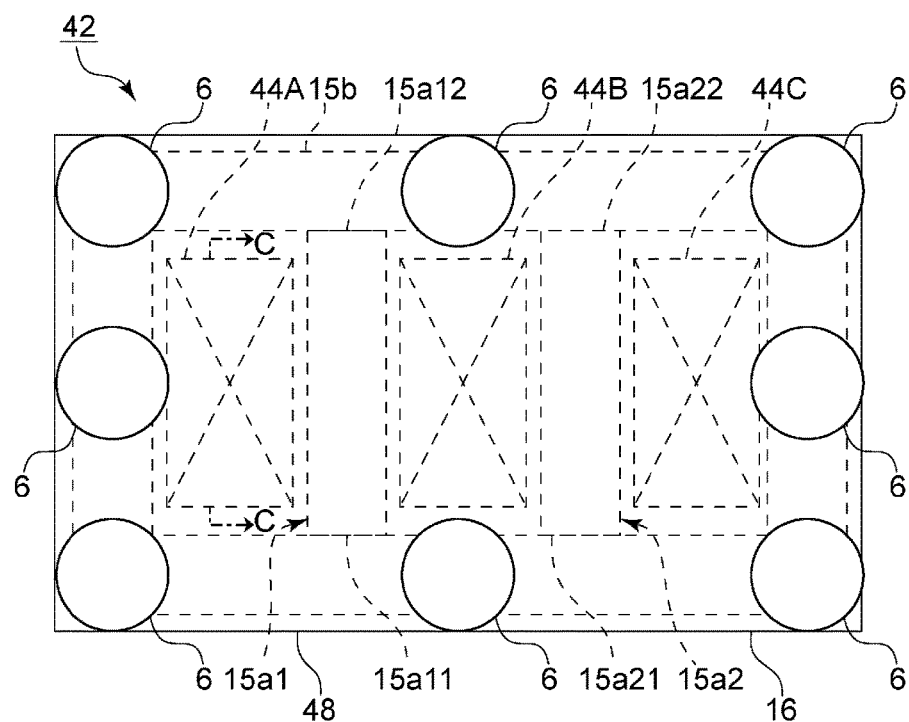
FIG. 9A is a plan view of an elastic wave element in a fourth preferred embodiment of the present invention.
Figure 9B:
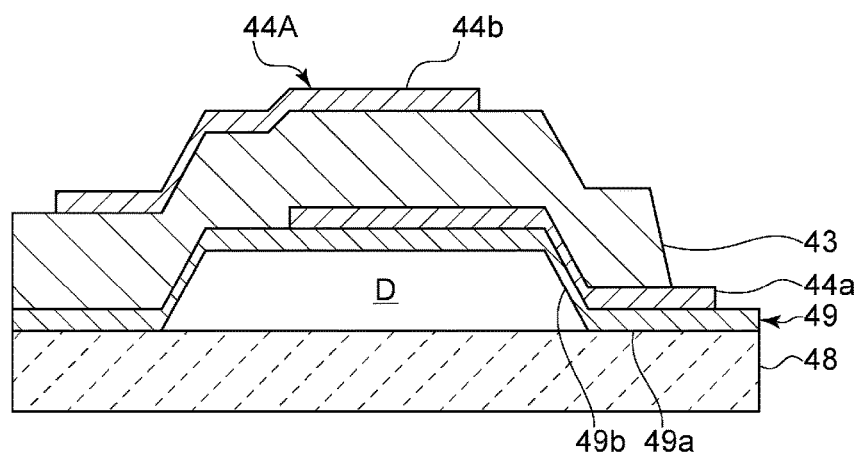
FIG. 9B is a cross-sectional view of an excitation portion of the elastic wave element taken along a line C-C in FIG. 9A.

FIG. 9A is a plan view of an elastic wave element in a fourth preferred embodiment of the present invention. FIG. 9B is a cross-sectional view of an excitation portion of the elastic wave element taken along a line C-C in FIG. 9A. Note that, in FIG. 9A, the excitation portion is illustrated using a schematic diagram obtained by drawing diagonal lines in a rectangle.

An elastic wave element 42 is a membrane type elastic wave element. In the elastic wave element 42, bulk waves are excited. In the fourth preferred embodiment, the configuration of a portion in which the bulk waves are excited is different from that in the first preferred embodiment. Furthermore, a substrate of the elastic wave element 42 is not limited to the piezoelectric substrate. In points except for the above-described points, the elastic wave element 42 and an elastic wave device of the fourth preferred embodiment have the same or substantially the same configuration as those of the elastic wave element 2 and the elastic wave device 1 of the first preferred embodiment.

As illustrated in FIG. 9A, the elastic wave element 42 includes the substrate 48. Although the material of the substrate is not particularly limited, a ceramic material or other suitable materials may be used.

On the substrate 48, excitation portions 44A to 44C in which bulk waves are excited are configured. All of the excitation portions 44A to 44C have the same or substantially the same configuration. Using FIG. 9B, the configuration of the excitation portion 44A will be described.

On the substrate 48, a dielectric film 49 is provided. The dielectric film 49 includes a first portion 49a making contact with the substrate 48 and a second portion 49b not making contact with the substrate 48. A gap D is disposed between the substrate 48 and the second portion 49b of the dielectric film 49. The dielectric film 49 may be made of $SiO_2$, SiN, or other suitable material, for example, but is not particularly limited thereto.

On the dielectric film 49, a first electrode 44a is provided. On the dielectric film 49 and the first electrode 44a, a piezoelectric body film 43 is provided. On the piezoelectric body film 43, a second electrode 44b is provided. The first electrode 44a and the second electrode 44b have portions opposing each other with the piezoelectric body film 43 interposed therebetween.

By applying a voltage to the first electrode 44a and the second electrode 44b, bulk waves are excited. The gap D is disposed between the excited portion as described above and the substrate 48. In this manner, the excitation portion 44A has a membrane type configuration.

The elastic wave device of the fourth preferred embodiment has a configuration in which the IDT electrodes 14a to 14c in FIG. 1 are replaced with the excitation portions 44A to 44C. Accordingly, in the present preferred embodiment as well, the same or similar effects as in the first preferred embodiment are able to be obtained.

The elastic wave devices according to preferred embodiments of the present invention are widely used in various electronic apparatuses and communication apparatuses. This example will be described using FIG. 10.

Figure 10:
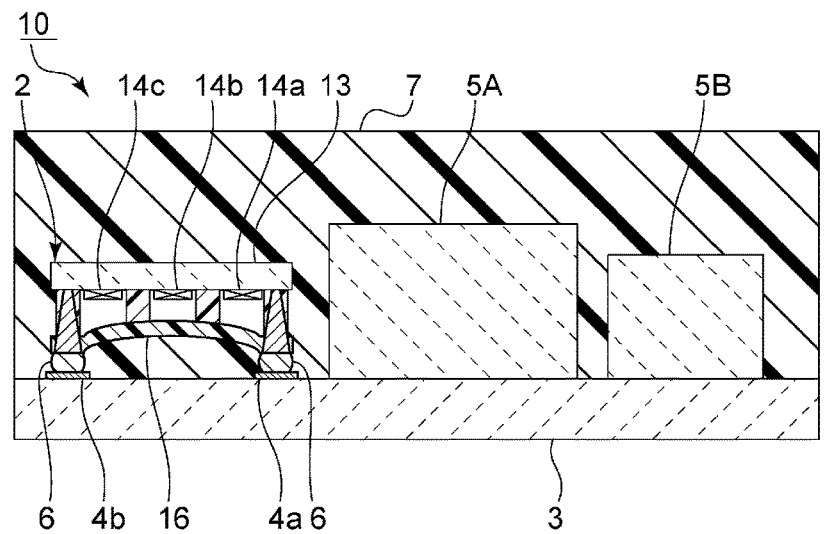
FIG. 10 is a front cross-sectional view of a communication module apparatus including the elastic wave device according to a preferred embodiment of the present invention.

FIG. 10 is a front cross-sectional view of a communication module apparatus including an elastic wave device according to a preferred embodiment of the present invention.

On the mounting substrate 3 of a communication module apparatus 10, the elastic wave element 2 and elements 5A and 5B are mounted. The elements 5A and 5B may be a passive element, such as a capacitor, a resistor, or other suitable passive elements, or may be an active element such as an IC, a transistor, or other suitable active elements. Note that, the number and a type of the elements mounted on the mounting substrate 3 are not particularly limited.

Figure 11:
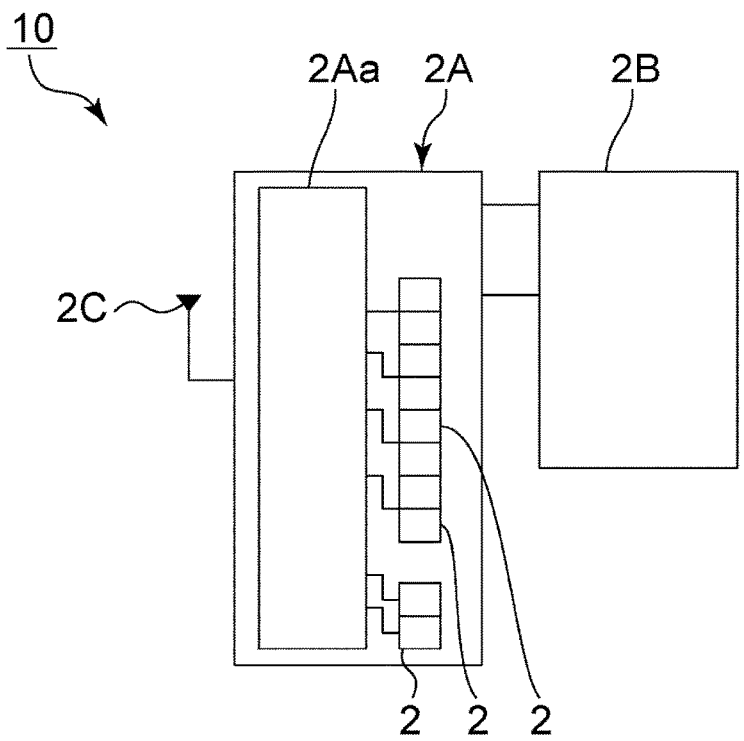
FIG. 11 is a block diagram illustrating an example of the communication module apparatus including the elastic wave device according to a preferred embodiment of the present invention.

FIG. 11 is a block diagram illustrating an example of the communication module apparatus including the elastic wave device according to a preferred embodiment of the present invention.

The communication module apparatus 10 includes, for example, a front-end portion 2A and an active element 2B connected to the front-end portion 2A. To be more specific, the front-end portion 2A includes a plurality of elastic wave elements 2 and a switch 2Aa. By the switch 2Aa, the elastic wave element 2 to be used is switched. The front-end portion 2A is connected to an antenna 2C. As the active element 2B, for example, a PA (Power Amplifier), an LNA (Low Noise Amplifier), or another suitable active element may be provided. This communication module apparatus 10 is used in a mobile communication apparatus, a health care communication apparatus, or other suitable apparatus.

The mobile communication apparatus includes a cellular phone, a smartphone, a car navigation system, or other suitable device. The health care apparatus includes a weight scale, a body fat scale, or other suitable devices or elements. The health care apparatus and the mobile communication apparatus are provided with an antenna, an RF module, an LSI, a display, an input unit, a power source, or the like, for example.

Here, in the case where a plurality of elements are mounted on the mounting substrate, it is preferable for spaces among the plurality of elements to be filled with the mold resin. Therefore, it has been difficult to sufficiently fill a space between the mounting substrate and the cover member of the elastic wave element with the mold resin. In contrast, as illustrated in FIG. 10, the cover member 16 of the elastic wave element 2 in the communication module apparatus 10 convexly curves towards the piezoelectric substrate 13 so as to be away from the mounting substrate 3. Accordingly, it is possible to reliably and sufficiently fill the space with the mold resin 7.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an elastic wave element including a piezoelectric substrate that includes a pair of main surfaces opposing each other, an excitation electrode provided on one main surface of the piezoelectric substrate, at least one first support layer provided on the one main surface of the piezoelectric substrate, a second support layer provided on the one main surface of the piezoelectric substrate so as to surround the excitation electrode and the at least one first support layer when viewed in a plan view, and a cover member provided on the first and second support layers and sealing the excitation electrode together with the second support layer and the piezoelectric substrate;
   a mounting substrate on which the elastic wave element is mounted; and
   a mold resin provided on the mounting substrate and sealing the elastic wave element; wherein a thickness of the at least one first support layer is less than a thickness of the second support layer;

the cover member convexly curves towards the piezoelectric substrate so as to be spaced away from the mounting substrate; and a space between the mounting substrate and the cover member is filled with the mold resin.

2. The elastic wave device according to claim 1, wherein the at least one first support layer has a width direction in a direction crossing the at least one first support layer;

the second support layer has a width direction in a direction crossing the second support layer; and a width of the at least one first support layer is less than a width of the second support layer.

3. The elastic wave device according to claim 2, wherein a plurality of the first support layers are provided;

a width of at least one first support layer of the plurality of first support layers is less than widths of others of the plurality of first support layers; and a thickness of at least one first support layer of the plurality of first support layers is less than thicknesses of others of the plurality of first support layers.

4. The elastic wave device according to claim 1, wherein, when the elastic wave device is viewed in the plan view, the at least one first support layer makes contact with the second support layer at both ends of the at least one first support layer.

5. The elastic wave device according to claim 1, wherein the at least one first support layer includes a first end portion and a second end portion, the first end portion of the at least one first support layer makes contact with the second support layer, and a shape of the second end portion of the at least one first support layer is larger than a shape of a portion other than the second end portion, when the elastic wave device is viewed in the plan view.

6. The elastic wave device according to claim 1, wherein the at least one first support layer has a width direction in a direction crossing the at least one first support layer;

the second support layer has a width direction in a direction crossing the second support layer; and a width of the at least one first support layer is the same or substantially the same as a width of the second support layer.

7. A communication module apparatus comprising:
a front-end portion including the elastic wave device according to claim 1; and
an active element connected to the front-end portion.

8. The communication module apparatus according to claim 7, wherein
the at least one first support layer has a width direction in a direction crossing the at least one first support layer;
the second support layer has a width direction in a direction crossing the second support layer; and
a width of the at least one first support layer is less than a width of the second support layer.

9. The communication module apparatus according to claim 8, wherein
a plurality of the first support layers are provided;
a width of at least one first support layer of the plurality of first support layers is less than widths of others of the plurality of first support layers; and
a thickness of at least one first support layer of the plurality of first support layers is less than thicknesses of others of the plurality of first support layers.

10. The communication module apparatus according to claim 7, wherein, when the elastic wave device is viewed in the plan view, the at least one first support layer makes contact with the second support layer at both ends of the at least one first support layer.

11. The communication module apparatus according to claim 7, wherein the at least one first support layer includes a first end portion and a second end portion, the first end portion of the at least one first support layer makes contact with the second support layer, and a shape of the second end portion of the at least one first support layer is larger than a shape of a portion other than the second end portion, when the elastic wave device is viewed in the plan view.

12. The communication module apparatus according to claim 7, wherein
the at least one first support layer has a width direction in a direction crossing the at least one first support layer;
the second support layer has a width direction in a direction crossing the second support layer; and
a width of the at least one first support layer is the same or substantially the same as a width of the second support layer.

13. A method for manufacturing an elastic wave device comprising:
a step of manufacturing an elastic wave element including a piezoelectric substrate that includes a pair of main surfaces opposing each other, an excitation electrode provided on one main surface of the piezoelectric substrate, at least one first support layer provided on the one main surface of the piezoelectric substrate, a second support layer provided on the one main surface of the piezoelectric substrate so as to surround the excitation electrode and the at least one first support layer when viewed in a plan view, and a cover member provided on the first and second support layers and sealing the excitation electrode together with the second support layer and the piezoelectric substrate;
a step of mounting the elastic wave element on a mounting substrate; and
a step of providing a mold resin on the mounting substrate and sealing the elastic wave element; wherein
in the step of manufacturing the elastic wave element, the first and second support layers are provided such that a thickness of the at least one first support layer is less than a thickness of the second support layer, and the cover member is convexly curved towards the piezoelectric substrate so as to be spaced away from the mounting substrate; and
in the step of sealing the elastic wave element, the mold resin is provided so as to fill a space between the mounting substrate and the cover member with the mold resin.

14. The method for manufacturing the elastic wave device according to claim 13, wherein a plurality of the first support layers are provided, and the plurality of first support layers are provided such that a width of at least one first support layer of the plurality of first support layers is smaller than widths of other first support layers.

15. The method for manufacturing the elastic wave device according to claim 14, wherein a thickness of at least one first support layer of the plurality of first support layers is less than thicknesses of others of the plurality of first support layers.

16. The method for manufacturing the elastic wave device according to claim 13, wherein
the at least one first support layer has a width direction in a direction crossing the at least one first support layer;
the second support layer has a width direction in a direction crossing the second support layer; and a width of the at least one first support layer is less than a width of the second support layer.

17. The method for manufacturing the elastic wave device according to claim 13, wherein, when the elastic wave device is viewed in the plan view, the at least one first support layer makes contact with the second support layer at both ends of the at least one first support layer.

18. The method for manufacturing the elastic wave device according to claim 13, wherein the at least one first support layer includes a first end portion and recessed second end portion, the first end portion of the at least one first support layer makes contact with the second support layer, and a shape of the second end portion of the at least one first support layer is larger than a shape of a portion other than the second end portion, when the elastic wave device is viewed in the plan view.

19. The method for manufacturing the elastic wave device according to claim 13, wherein
the at least one first support layer has a width direction in a direction crossing the at least one first support layer;
the second support layer has a width direction in a direction crossing the second support layer; and
a width of the at least one first support layer is the same or substantially the same as a width of the second support layer.

* * * * *